(12) United States Patent
Fleming

(10) Patent No.: US 10,479,850 B2
(45) Date of Patent: Nov. 19, 2019

(54) SHAPE FORMING PROCESS AND APPLICATION THEREOF FOR CREATING STRUCTURAL ELEMENTS AND DESIGNED OBJECTS

(71) Applicant: Robert J. Fleming, San Jose, CA (US)

(72) Inventor: Robert J. Fleming, San Jose, CA (US)

( * ) Notice: Subject to any disclaimer, the term of this patent is extended or adjusted under 35 U.S.C. 154(b) by 0 days.

(21) Appl. No.: 15/645,998

(22) Filed: Jul. 10, 2017

(65) Prior Publication Data

US 2017/0306066 A1    Oct. 26, 2017

Related U.S. Application Data

(62) Division of application No. 14/543,772, filed on Nov. 17, 2014, now abandoned.

(Continued)

(51) Int. Cl.

| | |
|---|---|
| *C08F 122/10* | (2006.01) |
| *B29C 70/02* | (2006.01) |
| *C08J 5/08* | (2006.01) |
| *B33Y 10/00* | (2015.01) |
| *H05K 3/00* | (2006.01) |
| *B29C 64/106* | (2017.01) |
| *C03C 25/285* | (2018.01) |
| *C08F 120/32* | (2006.01) |
| *H01B 1/20* | (2006.01) |
| *B29C 64/135* | (2017.01) |
| *B33Y 80/00* | (2015.01) |

(Continued)

(52) U.S. Cl.
CPC .......... *C08F 122/10* (2013.01); *B29C 64/106* (2017.08); *B29C 64/135* (2017.08); *B29C 70/021* (2013.01); *B33Y 10/00* (2014.12); *B33Y 80/00* (2014.12); *C03C 25/285* (2013.01); *C08F 120/32* (2013.01); *C08J 5/08* (2013.01); *H01B 1/20* (2013.01); *H05K 3/0014* (2013.01); *B29K 2105/0002* (2013.01); *B29K 2105/122* (2013.01); *B29K 2995/0005* (2013.01); *B29L 2031/3425* (2013.01); *B33Y 30/00* (2014.12); *C08F 222/1006* (2013.01); *H05K 1/0284* (2013.01); *Y10T 428/2933* (2015.01)

(58) Field of Classification Search
CPC ....... C08F 122/10; B33Y 10/00; B33Y 80/00; B29C 64/106; B29C 64/135; B29C 70/021
USPC ........................................................ 174/255
See application file for complete search history.

(56) References Cited

U.S. PATENT DOCUMENTS

| | | |
|---|---|---|
| 1,061,206 A | 5/1913 | Tesla |
| 3,740,565 A | 6/1973 | Wesley |

(Continued)

FOREIGN PATENT DOCUMENTS

| | | |
|---|---|---|
| DE | 102011109369 A1 | 2/2013 |
| EA | 13694 | 6/2010 |

(Continued)

OTHER PUBLICATIONS

International Search Report and Written Opinion dated Feb. 23, 2015, Application No. PCT/US2014/066000, 10 pages.

(Continued)

*Primary Examiner* — Tremesha S Willis
(74) *Attorney, Agent, or Firm* — Mahamedi IP Law LLP

(57) ABSTRACT

A tool provided that individually creates three-dimensional structural elements which are sequentially positioned into formation of a shaped object.

12 Claims, 6 Drawing Sheets

Related U.S. Application Data

(60) Provisional application No. 61/905,052, filed on Nov. 15, 2013.

(51) Int. Cl.
    *B33Y 30/00*     (2015.01)
    *B29K 105/00*     (2006.01)
    *B29K 105/12*     (2006.01)
    *B29L 31/34*     (2006.01)
    *H05K 1/02*     (2006.01)
    *C08F 222/10*     (2006.01)

(56) References Cited

U.S. PATENT DOCUMENTS

| | | | |
|---|---|---|---|
| 4,219,739 | A | 8/1980 | Greenwell |
| 5,936,861 | A | 8/1999 | Jang et al. |
| 6,202,782 | B1 | 3/2001 | Hatanaka |
| 6,558,146 | B1 | 5/2003 | Shah |
| 6,672,539 | B1 | 1/2004 | Schoeneck |
| 7,028,482 | B2 | 4/2006 | Cho et al. |
| 7,559,394 | B2 | 7/2009 | Rask et al. |
| 8,225,900 | B2 | 7/2012 | Domes |
| 9,511,543 | B2 * | 12/2016 | Tyler .................. B29C 67/0055 |
| 2003/0044593 | A1 | 3/2003 | Vaidyanthan et al. |
| 2004/0250760 | A1 * | 12/2004 | Goto ........................ B41J 2/145 |
| | | | 118/300 |
| 2005/0248065 | A1 | 11/2005 | Owada |
| 2005/0288813 | A1 | 12/2005 | Yang et al. |
| 2007/0003650 | A1 | 1/2007 | Schroeder |
| 2007/0228592 | A1 | 10/2007 | Dunn et al. |
| 2009/0250276 | A1 | 10/2009 | Goodwin et al. |
| 2010/0071883 | A1 | 3/2010 | Vetrovec |
| 2010/0112373 | A1 * | 5/2010 | Coffey .................... B32B 33/00 |
| | | | 428/608 |
| 2011/0018273 | A1 | 1/2011 | Burkholder et al. |

FOREIGN PATENT DOCUMENTS

| | | |
|---|---|---|
| WO | WO 2005/089090 A3 | 2/2006 |
| WO | WO 2008/057376 | 5/2008 |
| WO | WO 2009/112321 | 9/2009 |
| WO | WO 2014/131848 | 9/2014 |

OTHER PUBLICATIONS

International Search Report and Written Opinion dated Sep. 22, 2016, Application No. PCT/US2016/030481, 7 pages.
Chinese Office Action dated Jun. 28, 2017, Application No. 2014800730303, 11 pages.
Chinese Second Office Action dated Mar. 13, 2018, Application No. 2014800730303, 8 pages.
European Office Action, Communication pursuant to Rules 70(2) and 70a(2) EPC, dated Jul. 28, 2017, Application No. EP14861351.6 8 pages.

* cited by examiner

SHAPE FORMING PROCESS AND APPLICATION THEREOF FOR CREATING STRUCTURAL ELEMENTS AND DESIGNED OBJECTS

RELATED APPLICATIONS

This application is a Divisional of U.S. patent application Ser. No. 14/543,772, filed Nov. 17, 2014, which claims benefit of priority to U.S. Provisional Patent Application No. 61/905,052, filed Nov. 15, 2013; the aforementioned priority applications being hereby incorporated by reference in their respective entirety for all purposes.

TECHNICAL FIELD

Embodiments described herein relate generally to a shape forming process, and more specifically, to a shape forming process and application thereof for creating structural elements and designed objects.

BACKGROUND

Composites refer generally to a heterophase material containing a binder and a solid. A growing class of structural composites consist of an organic polymer binder or "resin" and a fiber, typically composed of glass, carbon, or natural. In some variations, the fiber can be formed from metal. The fiber is in the form of a filament (continuous or chopped), narrow strips of woven cloth, a bundle or roving, a braid, or made into strips or "tape". The structural composites industry is growing because of the desire for light weight—high stiffness materials for industries ranging from aerospace to recreational equipment. Composite materials are typically formed into shape via pre-formed molds that are costly and add to the development cycle time. Typically the steps required to build a composite part include: 1) design part, 2) make prototype part or [positive image], 3) make mold [negative image], 4) add release agent to mold, 5) add resin and fiber, 6) cure resin, 7) remove final part, and 8) clean or discard mold. These steps consume unnecessary time, materials, and waste adding to the cost of composite parts.

BRIEF DESCRIPTION

DETAILED DESCRIPTION

Figure 1:
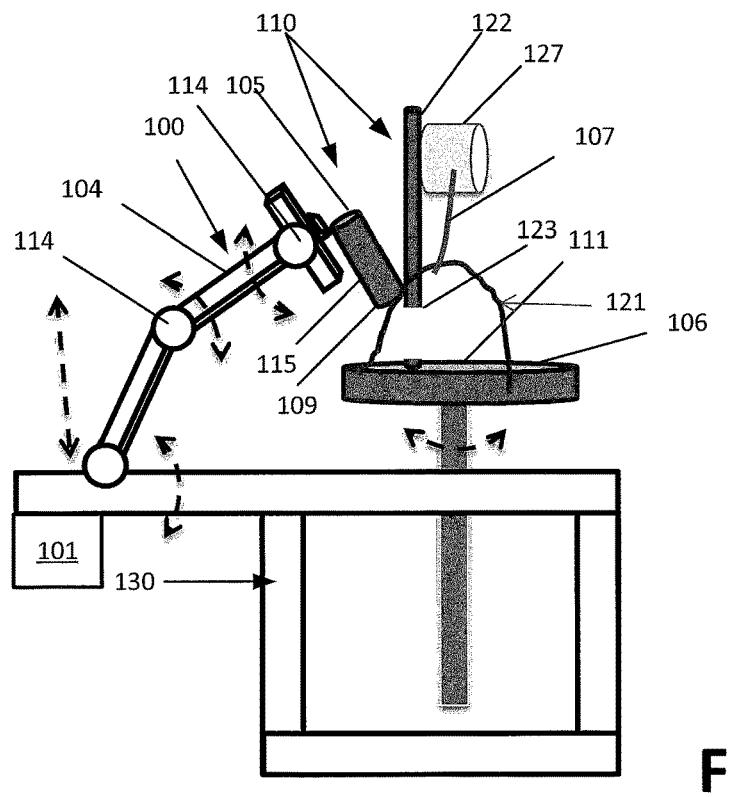
FIG. 1 illustrates a tool for performing a shape forming process and creating a structural element and design thereof, according to an embodiment.

Some embodiments include a system and method for creating a shaped or designed object by way of forming three-dimensional structural elements.

In one embodiment, a tool for creating a shaped three-dimensional structure includes a resin delivery mechanism, fiber source, a curation mechanism, and a controller. The fiber source may provide fiber that is concentrically combined with the resin. A curation mechanism cures the resin and/or fiber at a given position of a target location. A controller manipulates the resin and/or fiber into a desired shape, while the curation mechanism cures the resin and/or fiber in position.

A three-dimensional shaped element is an element that is shaped in place with no support structure, i.e. support, substrate, or mold that acts as a solid support to provide structure during the curing process. When a polymer is cured it transitions from a liquid or semi-solid to a rigid material and during that transition goes through a liquid or rubbery transition wherein it cannot support structure. In this invention the automated motion of the dispensing head provides the "structure" to shape in free-space while curing the pre-polymer material.

A four-dimensional shaped element is an element that is shaped in three-dimensions plus an added function that is shaped in place, for example, electrical wiring, circuitry, or conductivity. Other examples would be thermal conductivity or optical pathways.

According to some embodiments, a three-dimensionally shaped printing or wiring board is provided which includes a physical shape that has curvature and is formed from individually created structural elements. As an addition or alternative, some embodiments include an electronic device that is formed in free space without a solid shaped support.

Still further, some embodiments include a process, or tool for implementing a process, in which a three-dimensional object is formed in free space. A tool can implement a process of (i) delivering a precise amount of liquid resin with fiber, positioning the liquid resin coated fiber in X, Y, Z space, (ii) using curation by radiation or other energy source to solidify the resin-fiber composite, thereby locking the position of the material while delivering liquid resin and moving the position of the coated fiber. In some variations, the cured coated fiber is cut with a mechanical cutting mechanism or a laser.

In some embodiments, a tool is provided for creating a shaped object from combining three-dimensional structures. The tool includes a resin delivery mechanism, a fiber source, an energy source, and a controller. The resin delivery mechanism is positioned to deposit liquefied resin to a given target location. The fiber source supplies a fiber to the given target location. An energy source positioned to provide energy to resin deposited and cured at the target location. The energy source can be selected to be sufficient to liquefy the tip portion. A controller positions curation of the deposited resin at the target location, so that with manipulation of the fiber at the given location, the resin is structured into a three-dimensional structural element of a larger body.

According to some variations, the fiber source includes a fiber guide that can control movement of the fiber at the target location along 3-axes. The fiber guide can include a three-dimensional control mechanism for manipulating the fiber at the target location along 3-axes and 1 or more rotational axis. By way of example, the fiber is one or more of a monofilament, fiber bundle, ribbon, film, or tape.

Still further, in some variations, a knife or laser is used to cut the structural element after curing. The act of cutting and/or curing can be used to further shape the object being formed from the structural elements.

By way of example, embodiments described herein can be used to create shaped objects (or portions thereof), including body armor, prosthetics, personalized glasses or eyewear, handles or custom grips for an assortment of devices (guns, knives, hammers, game controllers, tennis racquets etc.), boats, sleds, skis, snowboards, furniture, chairs, stools, planets, racks, signs (including signs with electronic circuitry which can utilize conductive fibers or powder-infused resins), custom fiber optics or lights, and custom boxes and packaging equipment.

Tool Overview

FIG. 1 illustrates a tool for performing a shape forming process and creating a structural element and design thereof, according to an embodiment. In more detail, some embodiments include a tool 100 for creating a designed object from individual, three-dimensional structural elements of a desired shape. A designed object refers to any object designed by a user of the tool 100, having structural and geometric characteristics specified by design parameters. By way of example, a designed object can correspond to a shaped circuit board for carrying electronic circuitry and components in an electrically operable matter. The design parameters can, for example, specify a thickness, a contour, a shape, and an overall dimension of the shaped circuit board. The tool 100 operates to form the design object by sequentially creating individual structural elements on-site of the object while it is being formed. In this respect, the tool 100 can operate as a three-dimensional printer, but in contrast to conventional approaches which form two-dimensional layers into a finished object using addition of layers, an example tool 100 of FIG. 1 individually creates a three-dimensional structure element on site of the object being formed. Among other benefits, the resulting object can enable a more diverse range of designed objects having structurally sound characteristics. Additionally, some variations enable structural elements to include integrated conductivity, which can result in a three-dimensional shaped object with inherent electrical characteristics or ability. Additionally, shapes can be formed with large void spaces leading to parts with high stiffness and strength but also low weight.

In an embodiment, tool 100 includes a delivery mechanism 110 that couples resin with fiber to form a structural element. In more detail, tool 100 includes a robotic arm 104 optionally provided on an X-Y positioning stage 106 (e.g., rotatable stage) (as shown the robotic arm is not on the X-Y positioning stage or rotatable stage, the sample being formed is on a rotatable stage) to provide a three-plus axis positioning system. The arm 104 can pivot about one or more hinges 114 to enable a variety of motion and degrees of freedom. The arm can be provided on a platform 130, which serves to support and retain the arm 104, as well as other components such as the positioning stage 106. The positioning stage 106 can in turn support retention and shaping of an object being formed, such as a shaped structural composite part, circuit board or electrical element.

In one embodiment, the delivery mechanism 110 includes structures to separately deliver resin and fiber 107 onto a target 111. The resin delivery structure 105 can deliver a pre-determined amount of resin from a resin source through a conduit 115 to a region of the target. By way of example, resin delivery structure 105 can include a metering pump, such as a syringe pump, peristaltic pump, gear pump, or progressive cavity pump. A pump, for example, can deliver resin in liquid form to a head 109 that deposits a resin portion onto a substrate provided at the target region 111. The head 109 can be heated and/or vibrating to maintain a minimum viscosity of the resin. The head 109 can be cylindrical, flat, round or elongated, depending on the desired resin "drop" characteristic and material.

An example of FIG. 1 illustrates an implementation in which liquid resin is delivered onto a fiber at a target region 111, where the combination of resin and fiber are shaped. In more detail, prior to arrival of the resin, the fiber 107 is delivered from the fiber source 127 (e.g., spool), which can be mounted or operatively positioned to the robotic arm and/or target region. The fiber 107 can be delivered onto the target region 111 to engage a fiber guide 122 which can serve as a manipulation mechanism for the fiber. The fiber guide 122 can include or otherwise be operatively coupled to a manipulation tip 123. The manipulation tip 123 can correspond to a motorized component, which can move in height (e.g., along Z-axis) and/or laterally on the target region 111. For example, in FIG. 1, the fiber 107 is lifted up on the target region, where it is to receive the liquefied resin. At the target 111, the fiber guide 122 manipulates the fiber 107 in 3 dimensions in order to manipulate the fiber into a desired frame 121. The fiber guide 122 can position the fiber 107 in its proper location at the target region 111, and further position the fiber in free space to have a frame 121 of a desired shape. The fiber guide 122 can, for example, correspond to a point, ring, or small roller. As an addition or alternative, the fiber guide 122 can be hollow and the fiber 107 can be guided through the center of the fiber guide. Additionally, the fiber guide can be injected with liquid resin to couple or mix with the fiber.

In some variations, the fiber guide 122 can also include an optional cutting tool such as a mechanical knife or laser for when the resin/fiber is cured an during the process of forming an element or finished part. The cutting can, for example, terminate the structural element in dimension, or shape or contour the structural element.

In one embodiment, the resin is delivered by the resin delivery structure 105 into the fiber guide 122 at the target location 111. In one implementation, a curing process is performed which cures the liquid resin in place (e.g., over the frame 121). The curing process can utilize, for example, a visible or ultraviolet Light (UV) light source. As an alternative or addition, the curing process can utilize a radiation source to induce heat from infrared radiation, and the resin can be thermally cured. Examples of suitable resins include monomers with acrylate, epoxide, or vinyl reactive groups and resin formulations include thermally induced free-radical, UV photoinitiators or cationic UV photoinitiators. Optionally, the radiation source can induce heat, for example from infrared radiation, and the resin can be thermally cured. Among other achievements, an embodiment provides that the resin combines intimately with the fiber after contact with the fiber 107 and then quickly becomes a solid or semi-solid after start of the curing event. In order to minimize curing shrinkage that can occur with polymerization blends of acrylate and epoxy, functional resins can be combined with mixtures of free-radical photoinitiators and cationic photoinitiators. Also UV curable resins containing vinyl, acrylate, or epoxy groups can be combined with resins containing moisture or thermally curable groups such as isocyanates.

An example of FIG. 1 can further include one or more programmatic control mechanisms which control various mechanical functions of the tool 100. The controller 101 can manipulate the arm 104, control resin delivery (e.g., resin volume rate), control delivery (e.g., in speed) of fiber 107 from the fiber source, and/or control the manipulation tip 123.

Figure 2A:
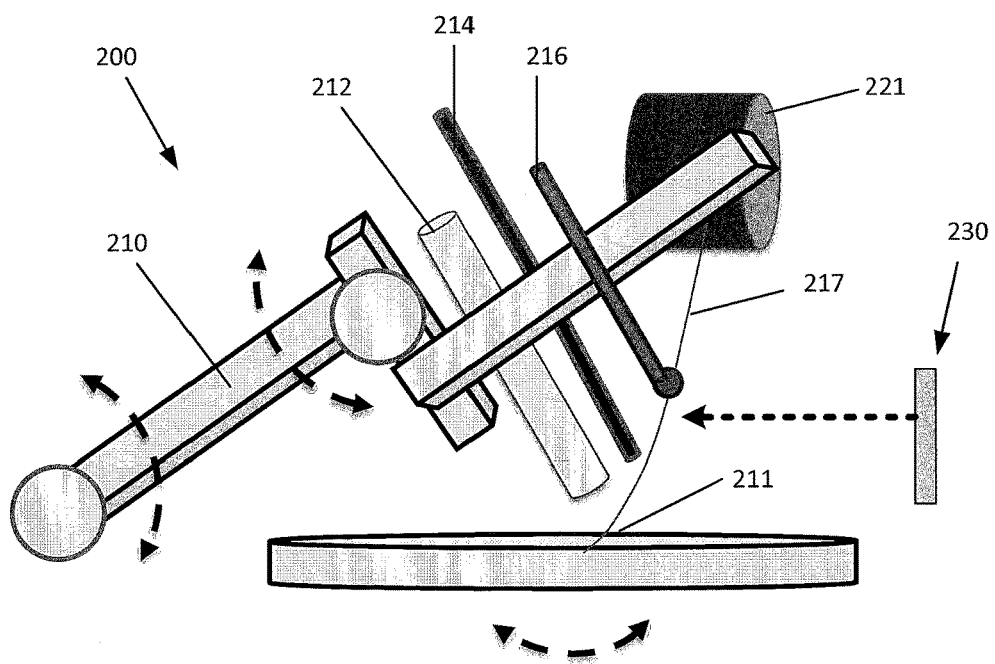
FIG. 2A illustrates a delivery mechanism for delivering resin and fiber onto a target region, according to another example.

FIG. 2A illustrates a sub-system for delivering and shaping resin and fiber onto a target region, according to another example. A sub-system 200 of FIG. 2A includes a robotic arm 210 comprising a curing source 212, a resin delivery mechanism 214, and a fiber guide 216. The fiber guide 216 positions and shapes fiber 217 (shown provided from spool 221) at the target region 211. In one implementation, the resin delivery mechanism 214 deposits resin on the fiber 217 when the fiber is positioned and shaped on the target region 211. The curing source 212 can provide, for example, ultraviolet radiation to the combination of the resin and fiber to form a structural element.

In another variation, the fiber 217 and resin can be combined into one conduit for delivery onto the target region 211. For example, with reference to FIG. 2A, the fiber guide 216 can be combined or serve as the conduit for the resin. The combined polymer and fiber can be deposited on the target region, and the positioning of the robot arm 210 can deposit resin in accordance with a three-dimensional pattern that correlates to the desired geometry for the resulting structural element. The curing source 212 can target radiation (e.g., UV radiation) and/or heat at resin/fiber deposits in order to solidify the deposited resin, so that the desired structure is formed. A cutting tool 230 can be operatively positioned to cut the cured resin or fiber/resin structure in order truncate, shave, contour or otherwise further shape the structural element formed. The cutting tool 230 can correspond, to, for example, such as a shearing knife or laser (e.g., CO2, UV, YAG, or other laser types of sufficient power to cut the cured resin/fiber).

Figure 2B:
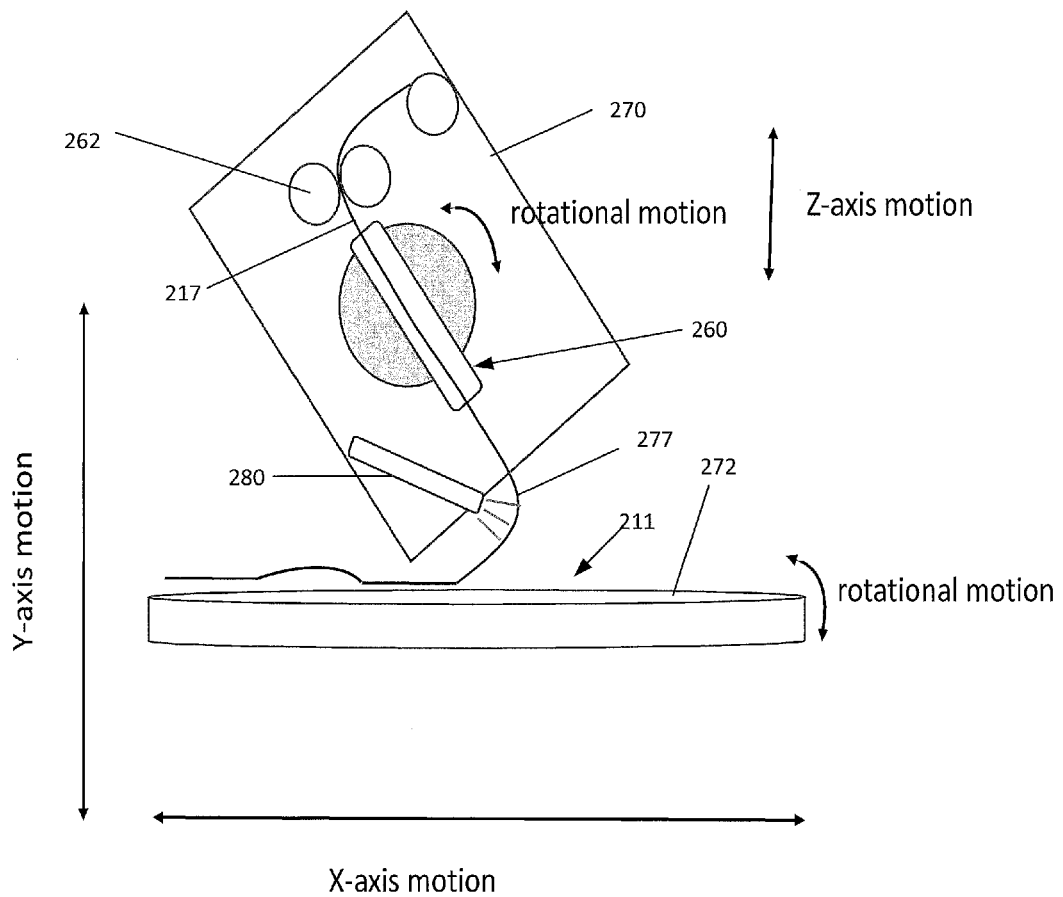
FIG. 2B illustrates an alternative sub-system for delivering and shaping resin and fiber onto a target region, according to another example.

FIG. 2B illustrates an alternative sub-system for delivering and shaping resin and fiber onto a target region, according to another example. In an example of FIG. 2B, fiber 217 and liquid resin are pushed through a feeder 260 and delivered as fiber/resin 277 at the target region 211. The fiber can be pushed through the feeder 260 using rollers 262, liquid resin can optionally be injected into feeder 260, 260 can also be referred to as the "feedblock". A housing 270 can pivot or rotate on a stage 272, and the stage is also capable of rotational motion. The movement of the housing 270 enables freedom in height (Z-axis). The combined material of fiber/resin 277 can be deposited on the target region 211, where the rotational motion of the stage 272 provides movement in X, Y directions. A curation mechanism 280 can instantly cure the fiber/resin 277 as it emerges from the feeder 260. The combined rotational (or alternatively elevational) movement of the housing 270, with the rotational movement of the stage 272 enables the formation of a strand or other structural element having a desired three-dimensional shape or contour.

Tool Control

Figure 3:
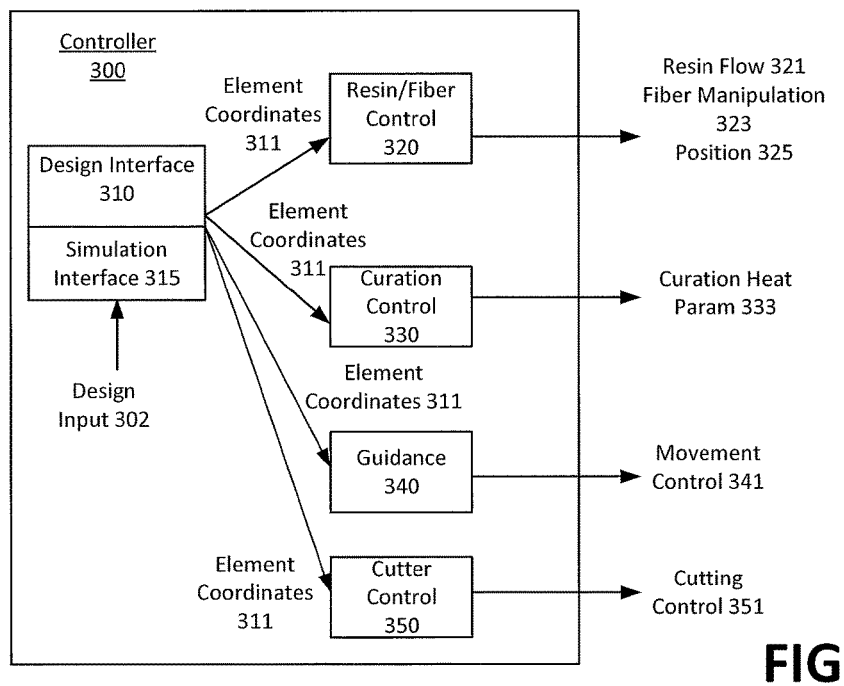
FIG. 3 illustrates a controller for controlling a tool that implements shape forming processes, as described with examples of FIG. 1 and FIG. 2A.

FIG. 3 illustrates a controller for controlling a tool that implements shape forming processes, as described with examples of FIG. 1 and FIG. 2A. For example, the controller 300 can be implemented as a programmatic or computer-driven mechanism to control precision movements and timed actions of tool 100 (FIG. 1).

In an embodiment, controller 300 includes a design interface 310, a simulation interface 315, a resin/fiber control 320, curation control 330, and guidance 340. The resin/fiber control 320 can be implemented in a manner such as described with an example of FIG. 2A, except that the fiber can be passed through a conduit of the resin prior to the resin being deposited at the target location.

The design interface 310 can receive design input 302, which can specify structural physical and/or electrical characteristics of a desired object, such as a printed circuit board, a shaped circuit board, or a prosthetic limb. The design parameters 302 can also specify structure elements, including a desired size and/or shape of a structural element. The simulation interface 315 can simulate the expected physical properties and optimize to meet design targets such as stiffness, break strength, or electrical pathways. The feedback provided through the simulation interface 315 can be based on known structural and mechanical properties of the resin and fiber, taking into account the overall thickness of the aggregation of structural elements used and the shape of the formed object. The simulation interface 315 can operate to provide feedback to the design interface to make necessary improvements, such as optimizations to the design. As described with other examples, structure elements can be sequentially formed and combined using the tool 100, so as to form the desired object.

Based on the design input 302, design interface 310 can generate parameters for forming structural elements. Furthermore, the design interface 310 can generate a free space coordinate and dimension corresponding to the three-dimensional object that is to be formed. Based on the determinations, the design interface 310 can signal element coordinates 311 to resin/fiber control 320, curation control 330 and guidance 340. The element coordinates 311 identify discrete locations in three-dimensional space in a region of the target. The guidance 340 can implement discrete and precision movement 341 of the robotic arm, for example, so that, the resin/fiber delivery mechanism can deposit and cure resin at specified coordinates in a sequential manner. The sequential placement of the resin and its curation at discrete locations can, for example, result in the formation of shaped strands or linear segments that form the structural element, and combination strands which collectively form the shaped object. As described with other examples, the structural elements (e.g., strands) can be shaped through fiber manipulation, curation, placement of resin, and/or cutting.

In more detail, the resin/fiber control 320 can receive the element coordinates 311 and implement processes to produce a shaped structural element at the target location. In particular, the resin fiber control 320 can generate control parameters for the output and use of the resin and fiber combination. The parameters can include a resin flow 321 parameter, which specifies the volumetric flow rate of resin at individual discrete locations, specified by the coordinates 311. Another parameter that can be specified is fiber manipulation 323, which specifies a geometric shape, dimension or set of dimensions for geometry of the structural element being formed. Still further, the resin/fiber control 320 can generate a parameter position 325, identifying in orientation and/or pinpoint location of a particular structure element to be formed, a view of coordinates 311. Likewise, the curation control 330 can generate a curation parameter 333, which can specify an output power, a temperature (if heat source is being used) or radiative power if a light source is being used, intensity, and/or duration of the curing energy source on the resin fiber combination.

The movement control 341 provided by the guidance 340 can correspond to a sequential traversal of coordinates in a defined three-dimensional space of an object under formation. In this way, the coordinates 311 can identify a sequence of coordinates where a structural element is formed by deposit of resin/fiber, followed by curing.

In some variations, a cutter control mechanism 350 can also be provided to control a cutting mechanism (e.g., cutting tool 230 of an example of FIG. 2A). The cutter control 350 can use element coordinates 311 and design parameters of the overall shaped object (e.g., dimensions, contour shape etc.) to generate cutting control data 351. The cutting control data 351 can be used by the cutting mechanism (e.g., cutting tool 230) in order to make cuts that terminate or shape individual elements (e.g., strands).

Figure 4:
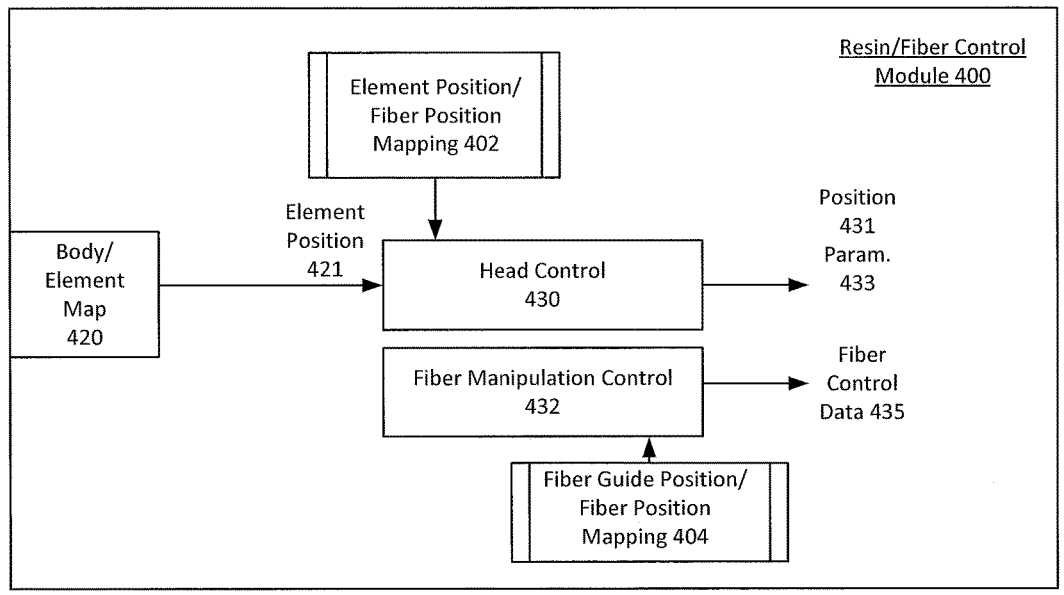
FIG. 4 illustrates an example sub-system for implementing resin/fiber control, according to another embodiment.

FIG. 4 illustrates an example sub-system for implementing resin/fiber control, according to another embodiment. A resin/fiber control module 400 of FIG. 4, for example, can be implemented as part of controller 300 (see FIG. 3). In one embodiment, resin/fiber control module 400 includes a body/element map 420, and a head control 430. The body/element map 420 generates the position coordinates that can control the guidance 340 (see FIG. 3). In particular, the body element map 420 signals element position 421 to the head controller 430. The element position 421 can correspond to a cord in three-dimensional space above the target location where the next structural element is to be formed. The head control 430 can implement mapping (e.g., element position to fiber position mapping 402) in order to determine position information 431 and other parameters 433 which affect placement of the resin/fiber combination. The position information 431 can reflect a coordinate, or set of coordinates (e.g., a linear length), in free space of the target region for deposit of resin or resin/fiber. The parameters 433 can reflect, for example, volumetric flow rate of resin (or resin with fiber combined) onto the target region.

In some variations, fiber manipulation control 432 can also be provided for use with a fiber manipulation mechanism (see e.g., fiber manipulation tip 123 of an example of FIG. 1). The fiber manipulation control 432 can shape a fiber element prior to the resin deposit. For example, with reference to FIG. 1, the manipulation tip 123 can reflect a motorized element that can lift the fiber in the Z direction. Alternatively, the fiber manipulation control 432 can shape the resin and fiber combination while the resin is still in a liquid state. The fiber manipulation control 432 can translate the manipulation tool position to desired fiber position on a target area. Logic 404 for mapping fiber manipulation to fiber position (and/or element position 421 can be employed in order to enable the fiber manipulation control 432 to output fiber control data 435. The fiber control data 435 can be received and processed by the fiber manipulation mechanism (e.g., fiber guide 122 and/or tip 123) in shaping the fiber portion of the individual structural elements (e.g., strands and/or linear segments) to a desired shape (e.g., curved strands or shaped/contoured linear lengths).

Structural Element Examples

Figure 5:
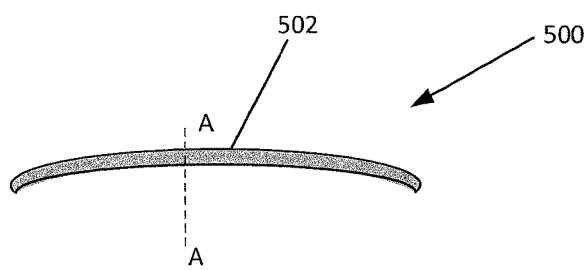
FIG. 5 illustrates an example of a structural element that can be produced using a tool such as described with examples of FIGS. 1-4.

FIG. 5 illustrates an example of a structural element that can be produced using a tool such as described with examples of FIGS. 1-4. The structural element 500 can be provided in the form of a shaped or contoured length (e.g., strand). For example, the element 500 can include a contoured section 502. In variations, the structural element 500 can include bends and other manipulations which shape the individual element. In one variation, the shape of the structural element 500 enables the element to be stacked or otherwise attached with other elements in order to form a desired object. In variations, alternative formations for the structural element 500 can be accomplished through bending and placement of segments, which are initially present at the target in liquid form and then cured into rigid form. The placement of the resin or resin/fiber forms a unit of the structural element, as the linear polymer placement and curation links directly to coordinate elements 311 generated from design input 302 (see FIG. 3). The overall dimension of the structural element 500 can vary significantly depending on implementation, such as, for example, between 5 mm and a meter. In specific applications for circuit boards (e.g., shaped or curved), the structural element 500 can range in dimension between 10 mm to 100 mm.

Figure 6A:
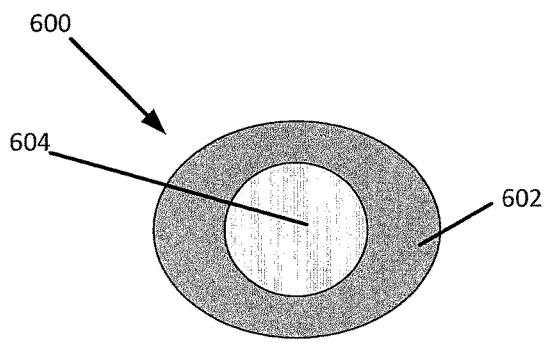
FIG. 6A and FIG. 6B illustrate alternative cross-sectional views of a segment of structural element, shown by line A-A, according to another aspect.
Figure 6B:
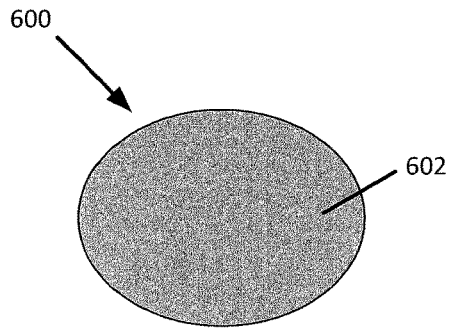

FIG. 6A and FIG. 6B illustrate alternative cross-sectional views of a segment 600 of structural element 500, shown by line A-A, according to another aspect. As the structural element 500 includes segments 600 that are uniformly present and made from common material (e.g., resin, or resin with fiber center), the cross-sectional representation of FIG. 6A and FIG. 6B can represent any portion of structural element 500. In an example of FIG. 6A, the segment 600 is composed of a resin shell 602 and a fiber core 604. The fiber core 604 can be formed from high modulus material, having fiber dimensions. In one embodiment, the individual fiber is selected to be of around 1-20 microns in diameter, and more specifically, between 5-10 microns. In variations, the fiber core 604 can have a diameter of the order of 1 micron or less. Still further, in another variation, the fiber core 604 is a bundle of fibers, such as multiple thin fibers, each of which are 10 micron fibers (e.g., sometimes called a "roving" with each fiber core being 0.5 mm in diameter). In one implementation, the fiber coated with resin ends up at around 1 mm when cured.

With further reference to an example of FIG. 6A, the fiber core 604 can be composed of glass, carbon or natural materials. By way of example, the fiber core 604 can be in the form of a filament (continuous or chopped), woven cloth, or made into strips or "tape". In some variations, the fiber core 604 is formed from conductive material. For example, the fiber core 604 can include conductive traces or powder.

The resin 602 can be formed from, for example, an organic polymer binder or blend, including resin formulations that include free-radical UV photoinitiators or cationic UV photoinitiators. Still further, in some variations the resin includes conductive material or powder. Still further, the resin can include metal particles that are sintered with a laser.

With reference to FIG. 6B, a variation is shown in which the unit includes resin and no fiber. In such a variation, the fiber can be used to shape the resin from the exterior while the resin is cured.

Methodology

Figure 7:
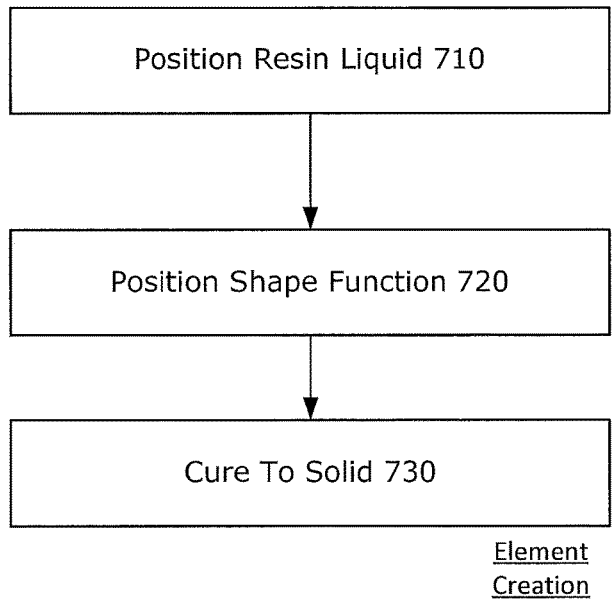
FIG. 7 illustrates a method for forming a structural element, according to an aspect.
Figure 8:
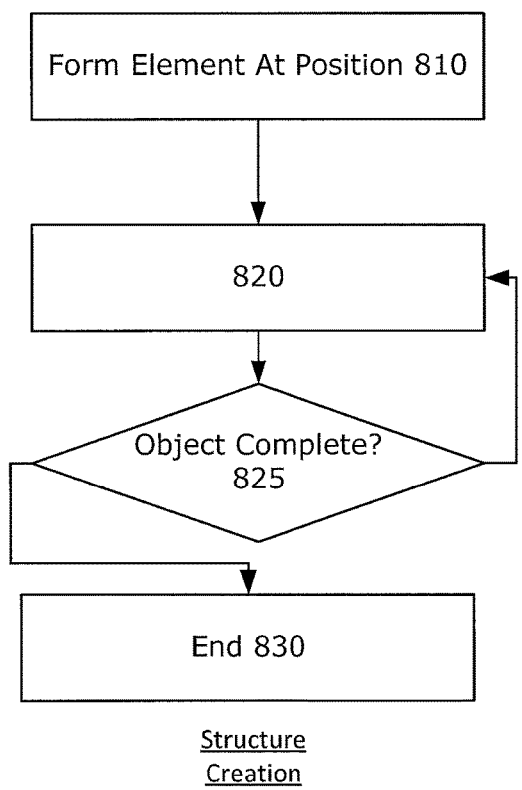
FIG. 8 illustrates a method for forming an object from structural elements, according to another example.

FIG. 7 illustrates a method for forming a structural element, according to an aspect. FIG. 8 illustrates a method for forming an object from structural elements, according to another example. An example method such as described by FIG. 7 or FIG. 8 can be implemented using components described with previous examples. Accordingly, reference may be made to components of prior examples for purpose of illustrating a suitable component for performing a step or sub step being described.

With reference to FIG. 7, a structural element can be formed by positioning a delivery mechanism to deposit resin in liquid form (710). The resin can be deposited as, for example, either a homogeneous thickness (e.g., see FIG. 6B) or as a resin/fiber combination (e.g., see FIG. 6A). By way of example, the resin can include a monomer with one or more of acrylate, epoxide, or a vinyl reactive group. In a variation, fiber can be moved through, for example, a tubular quantity of resin so that the resin is deposited in a liquid state on the target area with fiber present.

As deposited, the resin is shaped into the desired geometry (720). In one embodiment, the resin can be shaped by the fiber, which provides an exterior force. In a variation, the fiber can be provided with the resin and the fiber can provide an interior force for shaping the resulting resin/fiber combination. Accordingly, under one implementation, the fiber can be manipulated to shape the deposited resin. The desired geometry can be pre-selected based on, for example, material characteristics of the resin and/or desired characteristics of the structural element.

In order to enable shaping, the resin (or resin/fiber) can be cured into solid form (730). The curation can occur near instantly after the resin (or resin/fiber) is deposited. The result is the formation of a structural element comprising a material having a rigid and stable three-dimensional shape, formed in part by curing the material from a liquid state in free space. The material of the structural element can be homogeneous (e.g., resin only) or heterogeneous (e.g., resin with fiber and/or conductive particles).

A structural element of FIG. 8 can be uniformly integrated with other structures by sequential formation, such as provided through a stitch pattern. More specifically, with reference to FIG. 8, a structural element is formed in position, as dictated by coordinates generated from the controller 300 (e.g. see stitch pattern) (810). The next element is formed in sequence based on the predetermined sequence or stitch pattern (820). The structural elements (e.g., contoured strands) can be stacked or otherwise agglomerated onto each other to form a desired end shape. Once the object (or designated portion thereof) is determined to be complete (825), the process ends (830). Until the determination, the sequence followed and additional structural elements are formed. Optionally, cutting can be performed at either the strand or unit level in order to further shape the desired object.

A result of FIG. 8 includes a structural elements that are unitarily formed into a body. Each structural element includes a material having a rigid and stable three-dimensional shape that is formed into the body by curing the material from a liquid state. In forming the body, each of the structural elements is sequentially formed at a corresponding location of the body.

Example

Figure 9:
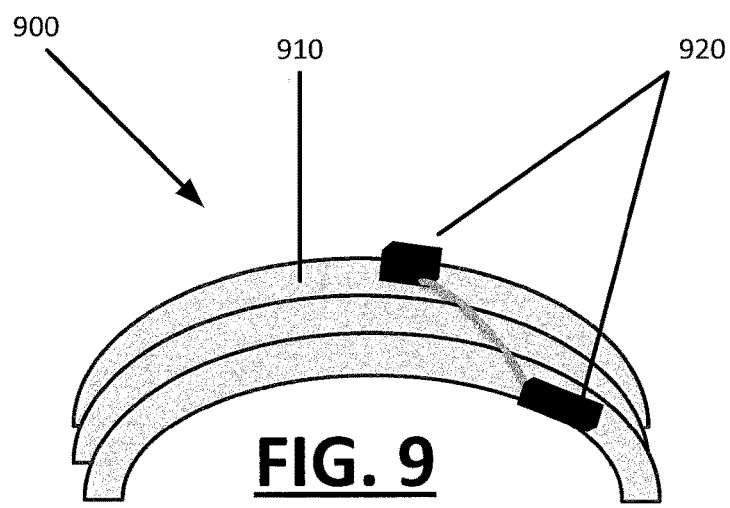
FIG. 9 illustrates an example of a shaped object produced using a structural element such as described with examples provided herein.

FIG. 9 illustrates an example of a shaped object produced using a structural element such as described with examples provided herein. In FIG. 9, a wiring board 900 is fabricated to have a desired shape, such as to conform to specifications for a wearable electronic device. In an example of FIG. 9, non-electrically conductive fibers and resins are integrated with conductive wires (tapes, strips, foils) and resins into a circuit board with curved shape and conductive traces in a given orientation in free space. The wiring board 900 can include sections 910, each of which is formed separately using a tool such as described with any of the examples provided herein. Electrical components can be formed or assembled on the surface of the wiring board 900. In some embodiments, the sections formed using, for example, a three-dimensional printing tool such as described with an example of FIG. 1, with structural elements include a fiber core or resin exterior which carry conductive traces or powder. With conductive core or traces thereof can be designed into electrical patters which can interconnect or ground electrical components 920 and other elements of the wiring board.

The conductive material and the non-conductive material can be deposited using the same robot and head or different head or robot. The conductive traces could also be formed by depositing metal particles as a powder or in a binder and sintered using a laser.

Examples

With reference to examples provided above, the tool 100 can be implemented as 3-axis machine with 3 stepper motors and a microcontroller. In such an example, the robotic arm 104 can, for example, enable movement of about 6 inches in Z-direction, and 18 inches in x and y directions.

The fiber source can correspond to, for example, a reel of S-glass fiber roving purchased from AGY CORORATION (provided under the product name of ZENTRON758-AB-675)

In some variations, a glass roving can be created by pulling a bobbin and pushed through a tube into a feedblock. The individual fiber can be around 10-20 microns in diameter and the roving can be around 0.5 mm in diameter The glass roving can be pulled/pushed in a controlled metering fashion using a stepper motor driven soft wheel and a steel bearing. Simultaneously a resin delivery mechanism can be implemented using a UV curable liquid resin, which can be metered to a feedblock using a syringe pump. A fiber coated with resin can be around 1 mm in diameter when cured.

One resin formulation that can be used includes 20 grams of SR494 liquid resin (ethoxylated pentaerythritol tetraacrylate), provided by the SARTOMER of the ARKEMA GROUP, 20 grams of CN2101E liquid resin (ethoxylated epoxy acrylate) also provided by the SARTOMER of the ARKEMA GROUP, 0.1 grams of Irgacure 819 (UV photoinitiator from BASF CORPORATION), mixed with spatula until the photoinitiator is dissolved in the liquid resin. The liquid resin was loaded into a syringe pump and pumped at the rate of 0.25 ml/minute into a feed block. An S-Glass roving (758-AB-675 from AGY CORPORATION) consisting of multiple individual 15 micron glass fibers can be pushed into the feed block using a stepper motor driving with a soft urethane foam wheel against a steel bearing.

The resin coated glass fiber roving can be UV cured into place with an OmniCure 2000 UV/Visible spot curing system from EXFO CORPORATION operated at partial power.

With further reference to examples provided above, a 3-axis stage with the feed block mounted to the head can be moved at approximately 600 mm/minute in a shaping pattern while the glass roving is pushed into the feed block at approximately the same rate, and while the liquid resin is pumped into the feed block to coat the resin at approximately 0.25 ml/min. The Omnicure 2000 spot curing light can be positioned to cure the fiber/resin as it exited the feedblock to form a shape. The diameter of the glass roving is approximately 0.15 mm and the diameter of the finished cured polymer coated glass roving is approximately 0.9 mm. The final cured polymer-glass composite is very stiff and not easily bendable.

As another example, multiple separate glass rovings can be twisted separately in one direction through twisting. The rovings can be twisted together in a counter-rotating direction to give a diameter of 0.3 mm. Liquid resin can be pumped onto the twisted rovings at about 0.6 ml/min, resulting in the final diameter of the fiber-resin element being about 1.5 mm.

As another example, three or more glass fibers or rovings can be braided together to for combination with liquid resin. Optionally, the liquid resin could be heated and pumped warm to control viscosity and also increase the cured speed.

In some implementations, the resin can be cured with Light Emitting Diodes (LEDs) that emit light in the UV region (e.g., 380 to 420 nm wavelength range).

Embodiments described herein can be implemented with any electronic device, including electronic devices that can be custom sized/shaped (e.g., wearable electronic devices). Embodiments described herein can also be implemented as part of customized recreational equipment (i.e. protective gear), prosthetic devices and electronic devices. Also custom body panels for cars, support brackets, chairs, frames, and other structural members could be formed. Examples described herein can also incorporate sections that are rigid and sections that are flexible.

Although illustrative embodiments have been described in detail herein with reference to the accompanying drawings, variations to specific embodiments and details are encompassed by this disclosure. It is intended that the scope of embodiments described herein be defined by claims and their equivalents. Furthermore, it is contemplated that a particular feature described, either individually or as part of an embodiment, can be combined with other individually described features, or parts of other embodiments. Thus, absence of describing combinations should not preclude the inventor(s) from claiming rights to such combinations.

What is claimed is:

1. A device comprising:
    a fiber source to supply a continuous length of fiber to one or more target locations;
    a fiber guide to control a movement of the fiber from the fiber source along 3-axes and one or more rotational axes;
    a resin delivery mechanism positioned to deposit liquefied resin to the one or more target locations and on the fiber;
    a rotatable stage to provide rotational movement in X and Y directions for manipulating the fiber at the one or more target locations;
    an energy source positioned to provide energy to resin deposited and cured at the given target location, sufficient to liquefy a tip portion; and
    a controller to position curation of the deposited resin at the given target location, so that with manipulation of the fiber at the one or more target locations, the liquified resin is structured into a three-dimensional structural element of a larger body.

2. The device of claim 1, wherein the fiber guide includes a manipulation tip that shapes the fiber.

3. The device of claim 2, wherein the manipulation tip shapes the fiber prior to depositing of the liquefied resin.

4. The device of claim 2, wherein the manipulation tip shapes the fiber and liquid resin combination.

5. The device of claim 4, wherein the manipulation tip shapes the fiber and liquid resin combination prior to curation.

6. The device of claim 1, wherein the fiber source provides the fiber that is one or more of a glass fiber, carbon fiber, natural fiber, conductive wire, a monofilament, fiber bundle, ribbon, film, or tape.

7. The device of claim 1, wherein the energy source includes ultraviolet light.

8. The device of claim 1, wherein a knife or laser is used to cut the three-dimensional structural element after curing.

9. The device of claim 1, wherein the three-dimensional structural element includes a conductive material.

10. The device of claim 9, wherein the larger body includes a network of electrical traces formed from the conductive material, the network of electrical traces providing electrical functionality through the conductive material.

11. The device of claim 1, wherein the liquified resin is a monomer with one or more acrylate, epoxide, isocyanate, or a vinyl reactive group.

12. The device of claim 11, wherein the liquified resin includes one of a free-radical ultraviolet photoinitiator formulation, or a cationic ultraviolet photoinitiator formulation.

* * * * *